US011568777B2

(12) United States Patent
Zheng et al.

(10) Patent No.: US 11,568,777 B2
(45) Date of Patent: Jan. 31, 2023

(54) SHIFT REGISTER UNIT AND DRIVING METHOD THEREOF, GATE DRIVING CIRCUIT AND DISPLAY DEVICE

(71) Applicant: BOE Technology Group Co., Ltd., Beijing (CN)

(72) Inventors: Haoliang Zheng, Beijing (CN); Seungwoo Han, Beijing (CN); Yi Ouyang, Beijing (CN); Minghua Xuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/327,056

(22) Filed: May 21, 2021

(65) Prior Publication Data

US 2022/0093024 A1 Mar. 24, 2022

(30) Foreign Application Priority Data

Sep. 24, 2020 (CN) ......................... 202011014791.5

(51) Int. Cl.

*G09G 3/00* (2006.01)
*G09G 3/20* (2006.01)
*G11C 19/28* (2006.01)

(52) U.S. Cl.

CPC ............... *G09G 3/20* (2013.01); *G09G 3/006* (2013.01); *G11C 19/28* (2013.01); *G09G 2300/0426* (2013.01); *G09G 2310/0267* (2013.01); *G09G 2310/0286* (2013.01); *G09G 2310/08* (2013.01); *G09G 2330/08* (2013.01); *G09G 2330/12* (2013.01)

(58) Field of Classification Search

CPC ............... G09G 2310/08; G09G 3/006; G09G 2310/0286; G09G 2330/12; G09G 2330/08; G09G 2310/0267

See application file for complete search history.

(56) References Cited

U.S. PATENT DOCUMENTS

2020/0143728 A1* 5/2020 Lee .......................... G09G 3/20
2022/0092287 A1* 3/2022 Shih ...................... G06F 3/0412

* cited by examiner

*Primary Examiner* — Dennis P Joseph

(74) *Attorney, Agent, or Firm* — Nath, Goldberg & Meyer; Joshua B. Goldberg

(57) ABSTRACT

The present disclosure provides a shift register unit and a driving method thereof, a gate driving circuit and a driving method thereof, and a display device. The shift register unit includes: a first shift register, a second shift register and a switch control circuit, signal input terminals of the first and second shift registers are coupled to a cascade signal input terminal through the switch control circuit, the switch control circuit is configured to allow a current between the signal input terminal of the first shift register and the cascade signal input terminal or not, and allow a current between the signal input terminal of the second shift register and the cascade signal input terminal or not; the first shift register and the second shift register are configured such that at least one of them operates upon receiving a cascade signal provided by the cascade signal input terminal.

17 Claims, 5 Drawing Sheets

SHIFT REGISTER UNIT AND DRIVING METHOD THEREOF, GATE DRIVING CIRCUIT AND DISPLAY DEVICE

CROSS REFERENCE TO RELATED APPLICATIONS

The present disclosure claims priority to Chinese patent application No. 202011014791.5 filed at the Chinese Intellectual Property Office on Sep. 24, 2020, the content of which is incorporated herein by reference in its entirety.

TECHNICAL FIELD

The represent disclosure relates to the field of display technology, and particularly relates to a shift register unit, a driving method of the shift register unit, a gate driving circuit and a display device.

BACKGROUND

A gate driving circuit of a display device in the related art at least includes a plurality of shift registers cascaded, and each shift register is coupled to a gate line for providing a driving signal to the gate line.

SUMMARY

An embodiment of the present disclosure provides a shift register unit, configured with a cascade signal input terminal and a driving signal output terminal, and including: a first shift register, a second shift register and a switch control circuit, a signal input terminal of the first shift register and a signal input terminal of the second shift register are both coupled to the switch control circuit, and a signal output terminal of the first shift register and a signal output terminal of the second shift register are both coupled to the driving signal output terminal;

the switch control circuit is configured to allow a current between the signal input terminal of the first shift register and the cascade signal input terminal or not, and allow a current between the signal input terminal of the second shift register and the cascade signal input terminal or not;

the first shift register and the second shift register are configured such that at least one of them operates upon receiving a cascade signal provided by the cascade signal input terminal.

In some implementations, the switch control circuit includes: a first gating sub-circuit and a second gating sub-circuit;

the first gating sub-circuit is coupled to a first control signal terminal, the cascade signal input terminal and the signal input terminal of the first shift register, and is configured to allow, in response to a control of a first control signal provided by the first control signal terminal, a current between the signal input terminal of the first shift register and the cascade signal input terminal or not;

the second gating sub-circuit is coupled to a second control signal terminal, the cascade signal input terminal, and the signal input terminal of the second shift register, and is configured to allow, in response to a control of a second control signal provided by the second control signal terminal, a current between the signal input terminal of the second shift register and the cascade signal input terminal or not.

In some implementations, the first gating sub-circuit includes a first control transistor, a control electrode of the first control transistor is coupled to the first control signal terminal, a first electrode of the first control transistor is coupled to the signal input terminal of the first shift register, and a second electrode of the first control transistor is coupled to the cascade signal input terminal;

the second gating sub-circuit includes a second control transistor, a control electrode of the second control transistor is coupled to the second control signal terminal, a first electrode of the second control transistor is coupled to the signal input terminal of the second shift register, and a second electrode of the second control transistor is coupled to the cascade signal input terminal.

In some implementations, the first shift register and the second shift register each include: an input sub-circuit, a pull-down control sub-circuit, an output sub-circuit and a pull-down sub-circuit, the input sub-circuit is coupled to the signal input terminal, a pull-up node and a clock signal terminal, and is configured to write, in response to a control of a first clock signal terminal, an input signal provided by the signal input terminal into the pull-up node;

the pull-down control sub-circuit is coupled to a first operating voltage terminal, the pull-up node, a pull-down node, and the first clock signal terminal, and is configured to write a first operating voltage provided by the first operating voltage terminal to the pull-down node in response to a control of the first clock signal terminal, and write a first clock signal provided by the first clock signal terminal to the pull-down node in response to a control of a voltage at the pull-up node;

the output sub-circuit is coupled to a second operating voltage terminal, the pull-up node, the pull-down node, the signal output terminal, and a second clock signal terminal, and is configured to write a second clock signal provided by the second clock signal terminal to the signal output terminal in response to a control of a voltage at the pull-up node, and write a second operating voltage provided by the second operating voltage terminal to the signal output terminal in response to a control of the pull-down node;

the pull-down sub-circuit is coupled to the second operating voltage terminal, the pull-up node, the pull-down node, and the second clock signal terminal, and is configured to write the second operating voltage to the pull-up node in response to a control of a voltage at the pull-down node and the second clock signal terminal.

In some implementations, the input sub-circuit includes a first transistor, a control electrode of the first transistor is coupled to the first clock signal terminal, a first electrode of the first transistor is coupled to the input signal terminal, and a second electrode of the first transistor is coupled to the pull-up node.

In some implementations, the pull-down control sub-circuit includes a second transistor and a third transistor, a control electrode of the second transistor is coupled to the pull-up node, a first electrode of the second transistor is coupled to the pull-down node, and a second electrode of the second transistor is coupled to the first clock signal terminal; a control electrode of the third transistor is coupled to the first clock signal terminal, a first electrode of the third transistor is coupled to the first operating voltage terminal, and a second electrode of the third transistor is coupled to the pull-down node.

In some implementations, the output sub-circuit includes a fourth transistor and a fifth transistor, a control electrode of the fourth transistor is coupled to the pull-down node, a first electrode of the fourth transistor is coupled to the second operating voltage terminal, and a second electrode of the fourth transistor is coupled to the signal output terminal;

and a control electrode of the fifth transistor is coupled to the pull-up node, a first electrode of the fifth transistor is coupled to the signal output terminal, and a second electrode of the fifth transistor is coupled to the second clock signal terminal.

In some implementations, the output sub-circuit further includes an eighth transistor, a first capacitor, and a second capacitor, where a control electrode of the eighth transistor is coupled to the first operating voltage terminal, a first electrode of the eighth transistor is coupled to the pull-up node, and a second electrode of the eighth transistor is coupled to the control electrode of the fifth transistor; a first terminal of the first capacitor is coupled to the control electrode of the fifth transistor, and a second terminal of the first capacitor is coupled to the signal output terminal; a first terminal of the second capacitor is coupled to the pull-down node, and a second terminal of the second capacitor is coupled to the first electrode of the fourth transistor.

In some implementations, the pull-down sub-circuit includes a sixth transistor and a seventh transistor, a control electrode of the sixth transistor is coupled to the pull-down node, a first electrode of the sixth transistor is coupled to the second operating voltage terminal, a second electrode of the sixth transistor is coupled to a first electrode of the seventh transistor, a control electrode of the seventh transistor is coupled to the second clock signal terminal, and a second electrode of the seventh transistor is coupled to the pull-up node.

In some implementations, the input sub-circuit includes a first transistor, the pull-down control sub-circuit includes a second transistor and a third transistor, the output sub-circuit includes a fourth transistor and a fifth transistor, the pull-down sub-circuit includes a sixth transistor and a seventh transistor, and where a control electrode of the first transistor is coupled to the first clock signal terminal, a first electrode of the first transistor is coupled to the input signal terminal, and a second electrode of the first transistor is coupled to the pull-up node;

a control electrode of the second transistor is coupled to the pull-up node, a first electrode of the second transistor is coupled to the pull-down node, and a second electrode of the second transistor is coupled to the first clock signal terminal;

a control electrode of the third transistor is coupled to the first clock signal terminal, a first electrode of the third transistor is coupled to the first operating voltage terminal, and a second electrode of the third transistor is coupled to the pull-down node;

a control electrode of the fourth transistor is coupled to the pull-down node, a first electrode of the fourth transistor is coupled to the second operating voltage terminal, and a second electrode of the fourth transistor is coupled to the signal output terminal;

a control electrode of the fifth transistor is coupled to the pull-up node, a first electrode of the fifth transistor is coupled to the signal output terminal, and a second electrode of the fifth transistor is coupled to the second clock signal terminal;

a control electrode of the sixth transistor is coupled to the pull-down node, a first electrode of the sixth transistor is coupled to the second operating voltage terminal, and a second electrode of the sixth transistor is coupled to a first electrode of the seventh transistor; and a control electrode of the seventh transistor is coupled to the second clock signal terminal, and a second electrode of the seventh transistor is coupled to the pull-up node.

In some implementations, the input sub-circuit includes a first transistor; the pull-down control sub-circuit includes a second transistor and a third transistor; the output sub-circuit includes a fourth transistor, a fifth transistor, an eighth transistor, a first capacitor and a second capacitor; the pull-down sub-circuit includes a sixth transistor and a seventh transistor, and where a control electrode of the first transistor is coupled to the first clock signal terminal, a first electrode of the first transistor is coupled to the input signal terminal, and a second electrode of the first transistor is coupled to the pull-up node;

a control electrode of the second transistor is coupled to the pull-up node, a first electrode of the second transistor is coupled to the pull-down node, and a second electrode of the second transistor is coupled to the first clock signal terminal;

a control electrode of the third transistor is coupled to the first clock signal terminal, a first electrode of the third transistor is coupled to the first operating voltage terminal, and a second electrode of the third transistor is coupled to the pull-down node;

a control electrode of the fourth transistor is coupled to the pull-down node, a first electrode of the fourth transistor is coupled to the second operating voltage terminal, and a second electrode of the fourth transistor is coupled to the signal output terminal;

a control electrode of the fifth transistor is coupled to a second electrode of the eighth transistor, a first electrode of the fifth transistor is coupled to the signal output terminal, and a second electrode of the fifth transistor is coupled to the second clock signal terminal;

a control electrode of the sixth transistor is coupled to the pull-down node, a first electrode of the sixth transistor is coupled to the second operating voltage terminal, and a second electrode of the sixth transistor is coupled to a first electrode of the seventh transistor;

a control electrode of the seventh transistor is coupled to the second clock signal terminal, and a second electrode of the seventh transistor is coupled to the pull-up node;

a control electrode of the eighth transistor is coupled to the first operating voltage terminal, and a first electrode of the eighth transistor is coupled to the pull-up node;

a first terminal of the first capacitor is coupled to the control electrode of the fifth transistor, and a second terminal of the first capacitor is coupled to the signal output terminal; and a first terminal of the second capacitor is coupled to the pull-down node, and a second terminal of the second capacitor is coupled to the first electrode of the fourth transistor.

In some implementations, all transistors in the shift register unit are N-type transistors; or all the transistors in the shift register unit are P-type transistors.

An embodiment of the present disclosure provides a driving method of a shift register unit, where the shift register unit adopts the shift register unit described above, the driving method including:

controlling the switch control circuit to write the cascade signal provided by the cascade signal input terminal into the signal input terminal of the first shift register and/or the signal input terminal of the second shift register; and enabling the first shift register and/or the second shift register to operate according to the received cascade signal.

In some implementations, the switch control circuit includes: a first gating sub-circuit and a second gating sub-circuit, the first gating sub-circuit is coupled to a first control signal terminal, the cascade signal input terminal and the signal input terminal of the first shift register, and is configured to allow, in response to a control of a first control signal provided by the first control signal terminal, a current between the signal input terminal of the first shift register and the cascade signal input terminal or not; the second gating sub-circuit is coupled to a second control signal terminal, the cascade signal input terminal, and the signal input terminal of the second shift register, and is configured to allow, in response to a control of a second control signal provided by the second control signal terminal, a current between the signal input terminal of the second shift register and the cascade signal input terminal or not, and where the step of controlling the switch control circuit to write the cascade signal provided by the cascade signal input terminal into the signal input terminal of the first shift register and/or the signal input terminal of the second shift register includes the following steps:

the first gating sub-circuit allows, in response to the control of the first control signal, a current between the signal input terminal of the first shift register and the cascade signal input terminal or not; and/or the second gating sub-circuit allows, in response to the control of the second control signal, a current between the signal input terminal of the second shift register and the cascade signal input terminal or not.

An embodiment of the present disclosure provides a gate driving circuit, including: a plurality of shift register units cascaded, each of the shift register units is configured with a corresponding cascade signal input terminal and a driving signal output terminal, where at least one of the shift register units is the shift register unit described above;

except the shift register unit in the first stage, the cascade signal input terminal of each of the shift register units in other stages is coupled to the driving signal output terminal of the shift register unit in the previous stage.

In some implementations, the switch control circuit includes: a first gating sub-circuit and a second gating sub-circuit, the first gating sub-circuit is coupled to a first control signal terminal, the cascade signal input terminal and the signal input terminal of the first shift register, and is configured to allow, in response to a control of a first control signal provided by the first control signal terminal, a current between the signal input terminal of the first shift register and the cascade signal input terminal or not; the second gating sub-circuit is coupled to a second control signal terminal, the cascade signal input terminal, and the signal input terminal of the second shift register, and is configured to allow, in response to a control of a second control signal provided by the second control signal terminal, a current between the signal input terminal of the second shift register and the cascade signal input terminal or not, and where first control signal terminals coupled to first gating sub-circuits in all the shift register units are the same signal terminal; and second control signal terminals coupled to second gating sub-circuits in all the shift register units are the same signal terminal.

An embodiment of the present disclosure provides a display device, including: the gate driving circuit described above.

An embodiment of the present disclosure provides a driving method of the gate driving circuit described above, the driving method including:

detecting whether an output current of the first shift register in each shift register unit is normal or not;

in response to that the first shift register whose output current is abnormal exists, determining a current stage of the shift register unit where the abnormal first shift register is located; and after the shift register unit in a stage immediately previous to the current stage of shift register unit outputs a driving signal, allowing, by the switch control circuit, a current through the second shift register in the shift register unit in the current stage, and allowing no current through the first shift register in the shift register unit in the current stage.

DESCRIPTION OF DRAWINGS

The accompanying drawings, which are included to provide a further understanding of the disclosure and are incorporated in and constitute a part of this specification, illustrate embodiments of the disclosure and together with the description serve to explain the disclosure, but do not constitute a limitation of the disclosure. In the drawings.

Reference Signs are as follows: INPUT: cascade signal input terminal; OUTPUT: driving signal output terminal; GOAL: first shift register; GOA2: second shift register; SW1: first control signal terminal; SW2: second control signal terminal; M01: first control transistor; M02: second control transistor; M1: first transistor; M2: second transistor; M3: third transistor; M4: fourth transistor; M5: fifth transistor; M6: sixth transistor; M7: seventh transistor; M8: eighth transistor; 1: switch control circuit; 2: input sub-circuit; 3: pull-down control sub-circuit; 4: output sub-circuit; 5: pull-down sub-circuit; CK: first clock signal terminal; CB: second clock signal terminal; STV: signal input terminal; G(n): signal output terminal; VL: first operating voltage terminal; VH: second operating voltage terminal; N1: pull-up node; N2: pull-down node; C1: first capacitor; C2: second capacitor.

DETAILED DESCRIPTION

In order that those skilled in the art will better understand the technical solutions of the present disclosure, the following detailed description is given with reference to the accompanying drawings and the specific implementations.

In a process of manufacturing or using display devices in the related art, if some shift registers of the display device are abnormal, for example, transistors in the shift registers fail, the yield of fine lines is low, or the like, the display device cannot normally display, and the yield of the display devices is low.

In the related art, in order to improve the yield of the display devices, redundant shift registers are added in a gate driving circuit of the display device, specifically, each original shift register corresponds to one redundant shift register, so that when the original shift register is abnormal, the corresponding redundant shift register can be started to provide a driving signal for a gate line, and normal display of the display device is ensured.

However, in such display device, the abnormal shift register is generally replaced by the redundant shift register by laser cutting, welding or the like to repair the gate driving circuit of the display device, but the repair process is complicated and cumbersome, and the repair process (such as laser) may generate debris to cause short circuit of lines.

In order to solve at least one of the above technical problems in the related art, the technical solutions of the present disclosure provide a shift register unit, a driving method of the shift register unit, a gate driving circuit and a display device.

Figure 1:
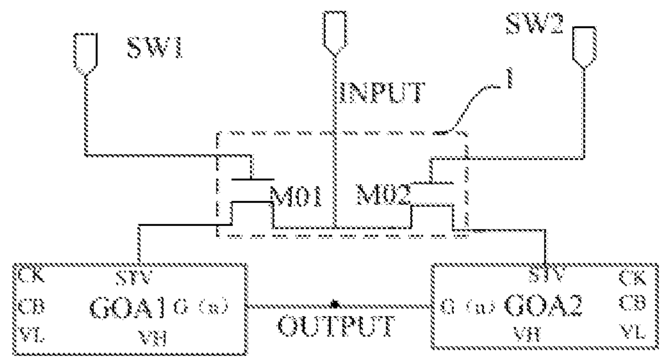
FIG. 1 is a schematic structural diagram of a shift register unit according to an embodiment of the present disclosure.
Figure 2A:
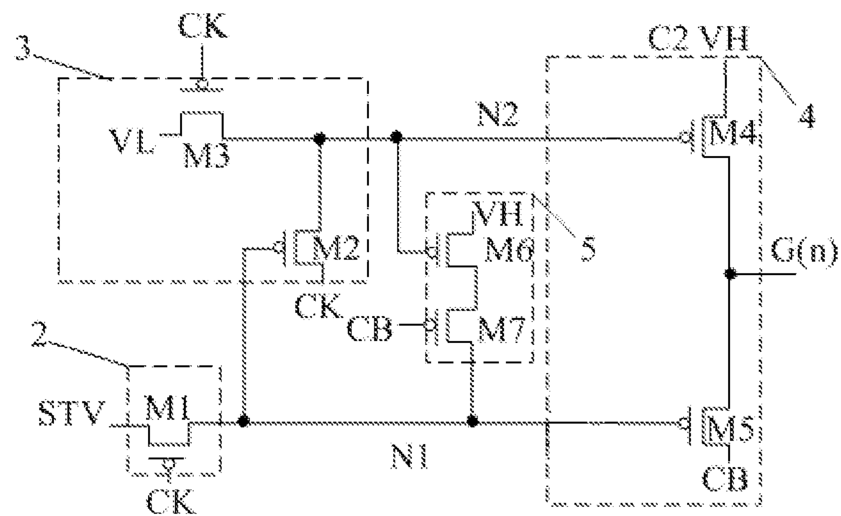
FIG. 2*a* is a schematic structural diagram of a first shift register in a shift register unit according to an embodiment of the present disclosure.
Figure 2B:
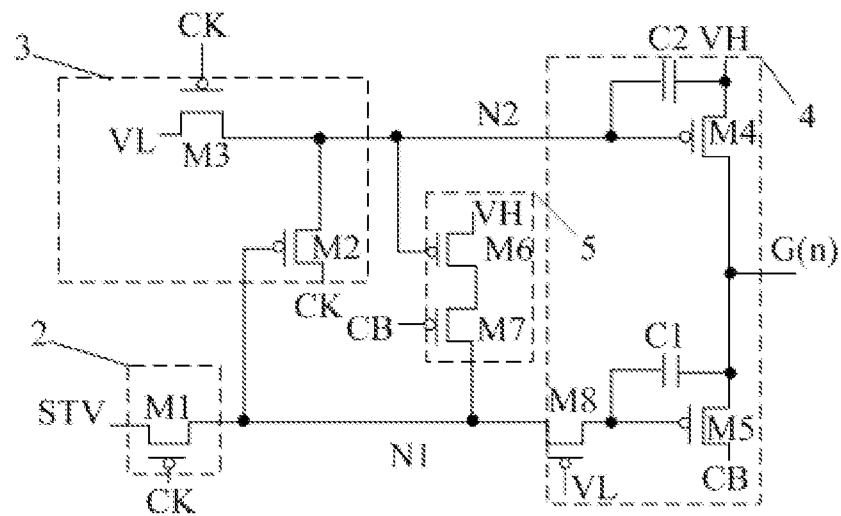
FIG. 2*b* is a schematic structural diagram of a first shift register in a shift register unit according to an embodiment of the present disclosure.
Figure 3:
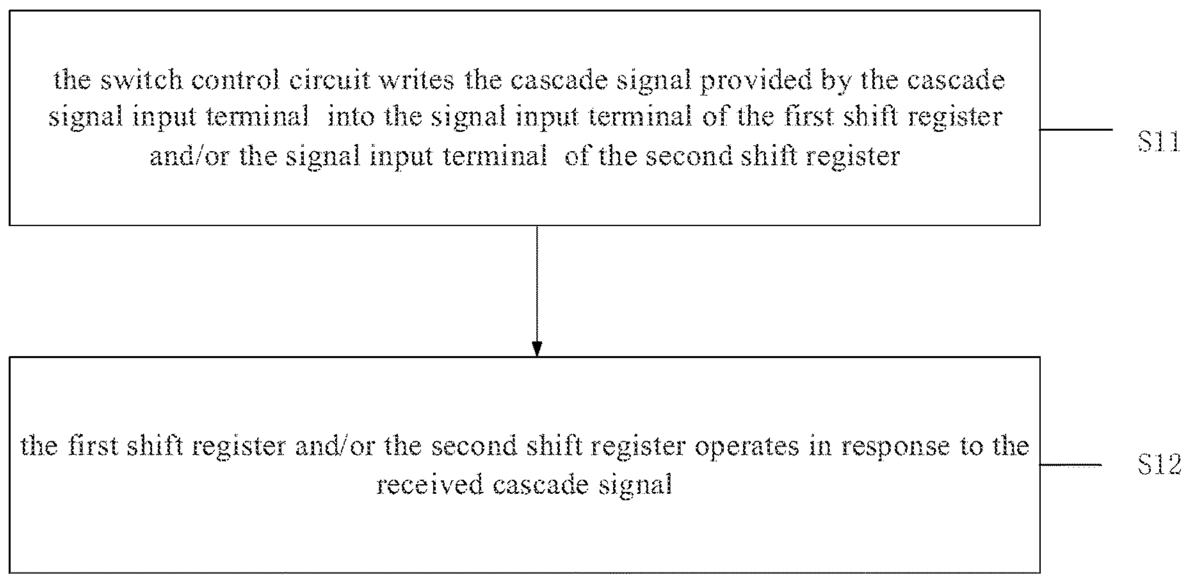
FIG. 3 is a schematic flowchart illustrating a driving method of a shift register unit according to an embodiment of the present disclosure.
Figure 4:
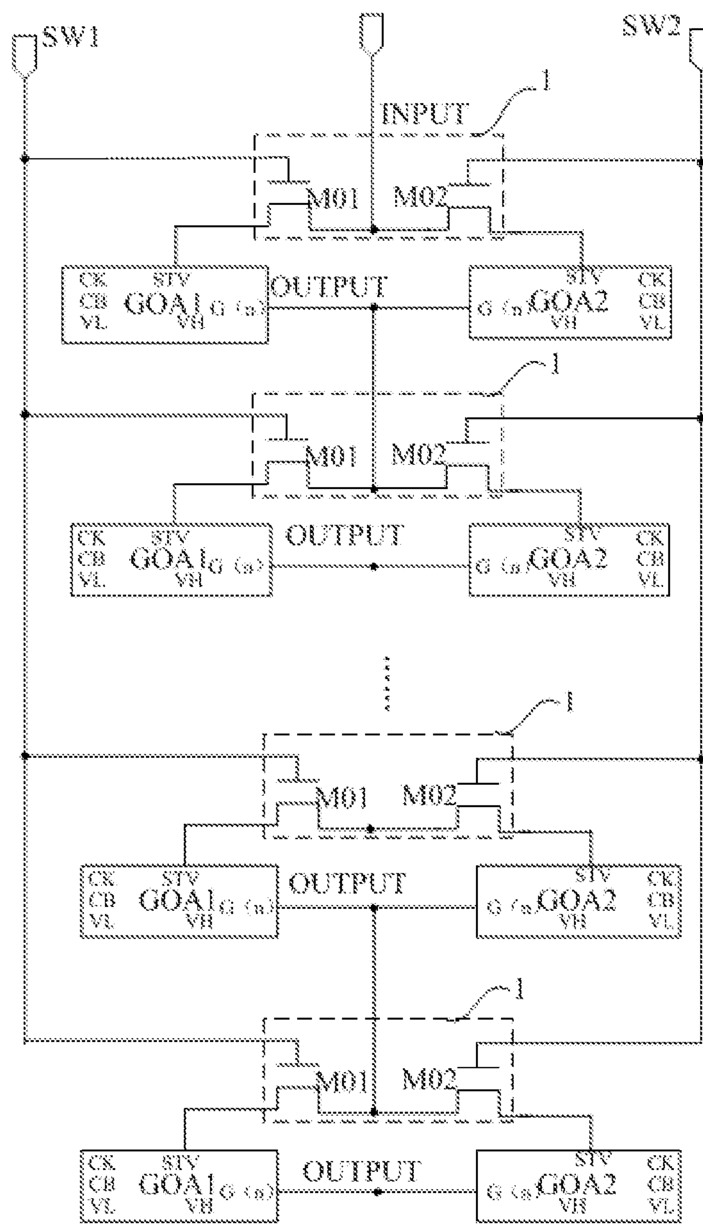
FIG. 4 is a schematic structural diagram of a gate driving circuit according to an embodiment of the disclosure.

An embodiment of the present disclosure provides a shift register unit, as shown in FIGS. 1 to 3, the shift register unit is configured with a cascade signal input terminal INPUT and a driving signal output terminal OUTPUT, the shift register unit includes: a first shift register GOA1 (a driving component), a second shift register GOA2 (a redundant component) and a switch control circuit 1, where a signal input terminal STV1 of the first shift register GOA1 and a signal input terminal STV2 of the second shift register GOA2 are both coupled to the switch control circuit 1, and a signal output terminal G(n) of the first shift register GOA and a signal output terminal G(n) of the second shift register GOA2 are both coupled to the driving signal output terminal OUTPUT.

The switch control circuit 1 is configured to allow a current between the signal input terminal STV1 of the first shift register GOA1 and the cascade signal input terminal INPUT or not, and to allow a current between the signal input terminal STV2 of the second shift register GOA2 and the cascade signal input terminal INPUT or not.

The first shift register GOA1 and the second shift register GOA2 are each configured to operate upon receiving a cascade signal provided by the cascade signal input terminal INPUT.

The driving signal output terminal OUTPUT is coupled to a gate line, so that the first shift register GOA1 or the second shift register GOA2 provides a driving signal to the gate line.

The switch control circuit 1 is configured to control the input of the cascade signal to the signal input terminal STV1 of the first shift register GOA or the signal input terminal STV2 of the second shift register GOA2, so that the first shift register GOA1 or the second shift register GOA2 provides the driving signal to the gate line.

The shift register unit of this embodiment includes the first shift register GOA1 and the second shift register GOA2, and when one of them is abnormal, the other can be started by the switch control circuit 1 to start operating, for example, when the first shift register GOA1 is abnormal, the second shift register GOA2 can be started by the switch control circuit 1 to start operating, so as to ensure that the gate line can receive the driving signal, and thus the display device corresponding to the shift register unit can display normally. The manner of selecting and controlling, by the switch control circuit 1, the first shift register GOA1 or the second shift register GOA2 to output the driving signal is simple.

In some implementations, the switch control circuit 1 includes: a first gating sub-circuit and a second gating sub-circuit; the first gating sub-circuit is coupled to the first control signal terminal SW1, the cascade signal input terminal INPUT, and the signal input terminal STV1 of the first shift register GOA1, and is configured to allow, in response to a control of a first control signal provided by the first control signal terminal SW1, a current between the signal input terminal STV1 of the first shift register GOA1 and the cascade signal input terminal INPUT or not; the second gating sub-circuit is coupled to the second control signal terminal SW2, the cascade signal input terminal INPUT, and the signal input terminal STV2 of the second shift register GOA2, and is configured to allow, in response to a control of a second control signal provided by the second control signal terminal SW2, a current between the signal input terminal STV2 of the second shift register GOA2 and the cascade signal input terminal INPUT or not.

As can be seen from the above, the switch control circuit 1 may be composed of two gating sub-circuits, i.e., the first gating sub-circuit and the second gating sub-circuit.

Specifically, the first gating sub-circuit includes a first control transistor M01, a control electrode of the first control transistor M01 is coupled to the first control signal terminal SW1, a first electrode of the first control transistor M01 is coupled to the signal input terminal STV1 of the first shift register GOA1, and a second electrode of the first control transistor M01 is coupled to the cascade signal input terminal INPUT; the second gating sub-circuit includes a second control transistor M02, a control electrode of the second control transistor M02 is coupled to the second control signal terminal SW2, a first electrode of the second control transistor M02 is coupled to the signal input terminal STV2 of the second shift register GOA2, and a second electrode of the second control transistor M02 is coupled to the cascade signal input terminal INPUT.

In some implementations, the first shift register GOA1 includes: an input sub-circuit 2, a pull-down control sub-circuit 3, an output sub-circuit 4, and a pull-down sub-circuit 5. The input sub-circuit 2 is coupled to a signal input terminal STV, a pull-up node N1, and a clock signal terminal, and is configured to write an input signal provided from the signal input terminal STV to the pull-up node N1 in response to a control of a first clock signal terminal CK.

The pull-down control sub-circuit 3 is coupled to a first operating voltage terminal, the pull-up node N1, a pull-down node N2, and the first clock signal terminal CK, and is configured to write a first operating voltage provided from the first operating voltage terminal to the pull-down node N2 in response to the control of the first clock signal terminal CK, and write a first clock signal provided from the first clock signal terminal CK to the pull-down node N2 in response to a control of a voltage at the pull-up node N1.

The output sub-circuit 4 is coupled to a second operating voltage terminal, the pull-up node N1, the pull-down node N2, the signal output terminal G(n), and a second clock signal terminal CB, and is configured to write a second clock signal provided by the second clock signal terminal CB to the signal output terminal G(n) in response to the control of the voltage at the pull-up node N1, and write a second operating voltage provided by the second operating voltage terminal to the signal output terminal G(n) in response to a control of the pull-down node N2.

The pull-down sub-circuit 5 is coupled to the second operating voltage terminal, the pull-up node N1, the pull-down node N2, and the second clock signal terminal CB, and is configured to write the second operating voltage to the pull-up node N1 in response to control of a voltage at the pull-down node N2 and the second clock signal terminal CB.

In some implementations, the first shift register GOA1 has the same circuit structure as the second shift register GOA2.

That is, the second shift register GOA2 also includes an input sub-circuit 2, a pull-down control sub-circuit 3, an output sub-circuit 4, and a pull-down sub-circuit 5, each having a structure identical to that of the corresponding sub-circuit in the first shift register GOA1.

In some implementations, as shown in FIG. 2*a*, the input sub-circuit 2 includes a first transistor M1, the pull-down control sub-circuit 3 includes a second transistor M2 and a third transistor M3, the output sub-circuit 4 includes a fourth transistor M4 and a fifth transistor M5, and the pull-down sub-circuit 5 includes a sixth transistor M6 and a seventh transistor M7.

A control electrode of the first transistor M1 is coupled to the first clock signal terminal CK, a first electrode of the first transistor M1 is coupled to the input signal terminal STV (STV1, STV2), and a second electrode of the first transistor M1 is coupled to the pull-up node N1.

A control electrode of the second transistor M2 is coupled to the pull-up node N1, a first electrode of the second transistor M2 is coupled to the pull-down node N2, and a second electrode of the second transistor M2 is coupled to the first clock signal terminal CK.

A control electrode of the third transistor M3 is coupled to the first clock signal terminal CK, a first electrode of the third transistor M3 is coupled to the first operating voltage terminal VL, and a second electrode of the third transistor M3 is coupled to the pull-down node N2.

A control electrode of the fourth transistor M4 is coupled to the pull-down node N2, a first electrode of the fourth transistor M4 is coupled to the second operating voltage terminal VH, and a second electrode of the fourth transistor M4 is coupled to the signal output terminal G(n).

A control electrode of the fifth transistor M5 is coupled to the pull-up node N1, a first electrode of the fifth transistor M5 is coupled to the signal output terminal G(n), and a second electrode of the fifth transistor M5 is coupled to the second clock signal terminal CB.

A control electrode of the sixth transistor M6 is coupled to the pull-down node N2, a first electrode of the sixth transistor M6 is coupled to the second operating voltage terminal VH, and a second electrode of the sixth transistor M6 is coupled to a first electrode of the seventh transistor M7.

A control electrode of the seventh transistor M7 is coupled to the second clock signal terminal CB, and a second electrode of the seventh transistor M7 is coupled to the pull-up node N1.

In some implementations, as shown in FIG. 2*b*, the output sub-circuit 4 further includes an eighth transistor M8, a first capacitor C1 and a second capacitor C2, where a control electrode of the eighth transistor M8 is coupled to the first operating voltage terminal VL, a first electrode of the eighth transistor M8 is coupled to the pull-up node N1, and a second electrode of the eighth transistor M8 is coupled to the control electrode of the fifth transistor M5.

A first terminal of the first capacitor C1 is coupled to the control electrode of the fifth transistor M5, and a second terminal of the first capacitor C1 is coupled to the signal output terminal G(n).

A first terminal of the second capacitor C2 is coupled to the pull-down node N2, and a second terminal of the second capacitor C2 is coupled to the first electrode of the fourth transistor M4.

In some implementations, all transistors in the shift register unit are N-type transistors; or all the transistors in the shift register unit are P-type transistors.

An embodiment of the present disclosure further provides a driving method of a shift register unit, where the shift register unit is the shift register unit in the above embodiment, and the driving method includes steps S11 and S12.

At step S11, the switch control circuit 1 writes the cascade signal provided by the cascade signal input terminal INPUT into the signal input terminal STV1 of the first shift register GOA1 and/or the signal input terminal STV2 of the second shift register GOA2.

Further, the step S11 that the switch control circuit 1 writes the cascade signal provided by the cascade signal input terminal INPUT into the signal input terminal STV1 of the first shift register GOA1 and/or the signal input terminal STV2 of the second shift register GOA2 includes:

the first gating sub-circuit allows, in response to the control of the first control signal, a current between the signal input terminal STV1 of the first shift register GOA1 and the cascade signal input terminal INPUT or not; and/or the second gating sub-circuit allows, in response to the control of the second control signal, a current between the signal input terminal STV2 of the second shift register GOA2 and the cascade signal INPUT or not.

At step S12, the first shift register GOA1 and/or the second shift register GOA2 operates in response to the received cascade signal.

Specifically, a turn-on signal is input to the first control signal terminal SW1, so that the first control transistor M01 is turned on, and a cascade signal from the cascade signal input terminal INPUT is written into the signal input terminal STV1 of the first shift register GOA1 through the first control transistor M01, so that the signal output terminal G(n) of the first shift register GOA1 outputs a driving signal; alternatively, a turn-on signal is input to the second control signal terminal SW2, so that the second control transistor M02 is turned on, and the cascade signal from the cascade signal input terminal INPUT is written into the signal input terminal STV2 of the second shift register GOA2 through the second control transistor M02, so that the signal output terminal G(n) of the second shift register GOA2 outputs a driving signal.

It should be noted that the driving method of the present embodiment does not exclude that signal output terminals G(n) of the first shift register GOA1 and the second shift register GOA2 provide driving signals to gate lines at the same time.

An embodiment of the present disclosure provides a gate driving circuit, as shown in FIGS. 1 to 6, including: a plurality of shift register units cascaded, each register unit is configured with a corresponding cascade signal input terminal INPUT and a corresponding driving signal output terminal OUTPUT, where at least one of the shift register units is the shift register unit in the above embodiment.

Except the shift register unit of a first stage, the cascade signal input terminal INPUT of each of the shift register units of other stages is coupled to the driving signal output terminal OUTPUT of the shift register unit of a previous stage.

Furthermore, first control signal terminals SW1 coupled to first gating sub-circuits in all the shift register units are the same signal terminal; second control signal terminals SW2 coupled to second gate sub-circuits in all the shift register units are the same signal terminal.

A driving method of the gate driving circuit of the present embodiment includes steps S21, S221 and S222.

At step S21, whether a second clock current corresponding to the second clock signal is normal is detected by a detection circuit.

Specifically, the current at the second electrode of the fifth transistor M5 in the first shift register GOA1 or the second shift register GOA2 is detected.

The detection circuit herein may be a detection circuit separated from the display device, or may be a detection circuit disposed in the display device, such as a detection chip.

At step S221, in response to that the second clock current of the first shift register GOA1 is abnormal, the shift register unit including the first shift register GOA1 is determined to be abnormal according to the abnormal second clock current (Icb).

In the operating period of the abnormal shift register unit, the cascade signal is written into the cascade signal input terminal INPUT, a turn-off signal is written into the first control terminal of the abnormal shift register, and a turn-on signal is written into the second control terminal of the abnormal shift register, so that the second shift register GOA2 outputs a driving signal.

S222, in response to that the second clock current of the first shift register GOA1 is normal, a cascade signal is written into the cascade signal input terminal INPUT, a turn-on signal is written into the first control terminal, and an turn-off signal is written into the second control terminal, so that the first shift register GOA1 outputs a driving signal.

Figure 5A:
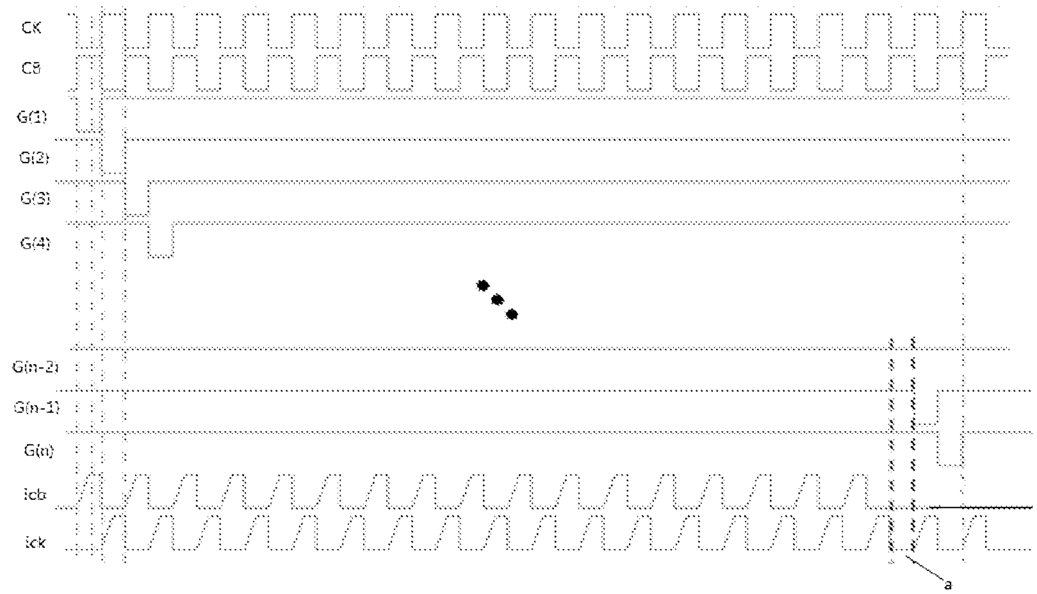
FIGS. 5*a* and 5*b* are timing diagrams of a gate driving circuit according to an embodiment of the present disclosure.
Figure 5B:
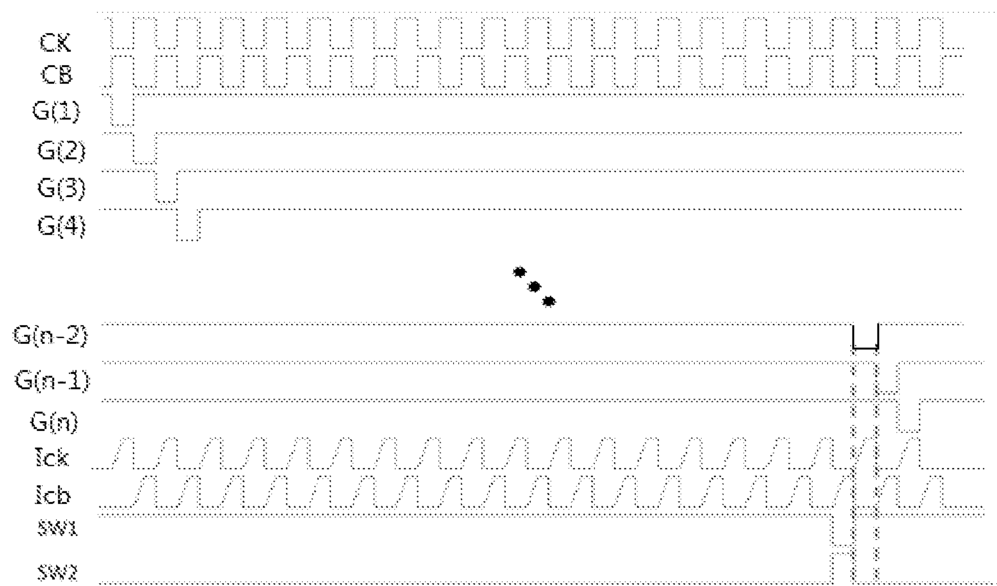
Figure 6:
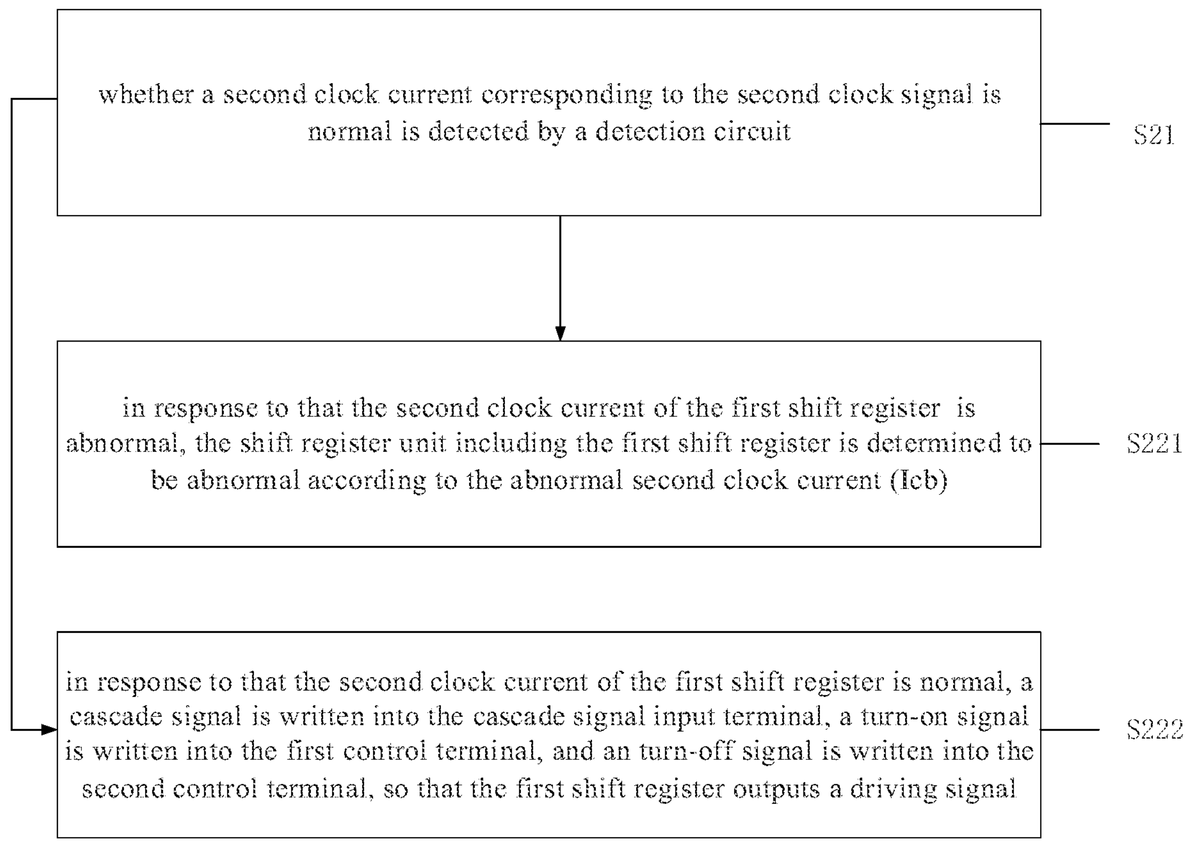
FIG. 6 is a schematic flowchart illustrating a driving method of a gate driving circuit according to an embodiment of the disclosure.

For example, as shown in FIGS. 5*a* and 5*b*, first, by default, the first shift register GOA1 can output the driving signal to the gate line. The second clock current (Icb) is detected, and in response to that the second clock current abnormally increases or decreases at a certain time (as shown in a portion a of FIG. 5*a*), the abnormal shift register can be identified. If the shift register unit with the abnormality is found to be in the $(n-2)^{th}$ stage by calculation, signals corresponding to the first control signal terminal SW1 and the first control signal terminal SW2 of the shift register unit in the $(n-2)^{th}$ stage are stored in an integrated circuit IC. When the output of the driving signal of the shift register unit in the $(n-3)^{th}$ stage is completed, a turn-off signal is input to the first control signal terminal SW1, and a turn-on signal is input to the second control signal terminal SW2, so that the driving signal is input to the gate line by the second shift register GOA2 in the shift register unit in the $(n-2)^{th}$ stage. As shown in FIG. 5*b*, in response to completion of the output of the driving signal of the shift register unit of the $(n-2)^{th}$ stage, a turn-on signal is input to the first control signal terminal SW1, and a turn-off signal is input to the second control signal terminal SW2, so that the first shift register GOA1 of the shift register unit in the $(n-1)^{th}$ stage inputs the driving signal to the gate line. The above process realizes the automatic replacement process of the first shift register GOA1 and the second shift register GOA2.

It should be noted that, the above driving method may be performed in a detection stage during the manufacturing process of the display device (e.g., after the backplane process is completed), or may be performed during the use of the display device.

An embodiment of the present disclosure provides a display device, including: the gate driving circuit in the above embodiment.

Specifically, the display device may be any product or component having a display function, such as a liquid crystal display panel, electronic paper, a mobile phone, a tablet computer, a television, a display, a notebook computer, a digital photo frame, and a navigator.

It should be noted that, in this disclosure, relational terms such as first and second, and the like are used solely to distinguish one entity or action from another entity or action without necessarily requiring or implying any actual such relationship or order between such entities or actions. Also, the terms "comprises" "includes" or any other variation thereof, are intended to cover a non-exclusive inclusion, such that a process, method, article, or apparatus that includes a list of elements not only include such elements but also include other elements not expressly listed or inherent to such process, method, article, or apparatus. Without further limitation, an element defined by the phrase "comprising an . . . " does not exclude the presence of other identical elements in the process, method, article, or apparatus that includes the element.

In accordance with the disclosed embodiments, as described above, these embodiments are not intended to be exhaustive or to limit the application to the precise embodiments disclosed. Obviously, many modifications and variations are possible in light of the above teaching. The embodiments were chosen and described in order to best explain the principles of the disclosure and the practical application, to thereby enable others skilled in the art to best utilize the disclosure and various embodiments with various modifications as are suited to the particular use contemplated. The present disclosure is to be limited only by the claims and their full scope and equivalents.

The invention claimed is:

1. A shift register unit, configured with a cascade signal input terminal and a driving signal output terminal, and comprising: a first shift register, a second shift register and a switch control circuit, a signal input terminal of the first shift register and a signal input terminal of the second shift register are both coupled to the switch control circuit, and a signal output terminal of the first shift register and a signal output terminal of the second shift register are both coupled to the driving signal output terminal;

the switch control circuit is configured to allow a current between the signal input terminal of the first shift register and the cascade signal input terminal or not and allow a current between the signal input terminal of the second shift register and the cascade signal input terminal or not;

the first shift register and the second shift register are configured such that at least one of them operates upon receiving a cascade signal provided by the cascade signal input terminal, wherein the switch control circuit comprises: a first gating sub-circuit and a second gating sub-circuit; the first gating sub-circuit is coupled to a first control signal terminal, the cascade signal input terminal and the signal input terminal of the first shift register, and is configured to allow, in response to a control of a first control signal provided by the first control signal terminal, a current between the signal input terminal of the first shift register and the cascade signal input terminal or not; the second gating sub-circuit is coupled to a second control signal terminal, the cascade signal input terminal, and the signal input terminal of the second shift register, and is configured to allow, in response to a control of a second control signal provided by the second control signal terminal, a current between the signal input terminal of the second shift register and the cascade signal input terminal or not;

the first gating sub-circuit comprises a first control transistor, a control electrode of the first control transistor is coupled to the first control signal terminal, a first electrode of the first control transistor is coupled to the signal input terminal of the first shift register, and a second electrode of the first control transistor is coupled to the cascade signal input terminal;

the second gating sub-circuit comprises a second control transistor, a control electrode of the second control transistor is coupled to the second control signal terminal, a first electrode of the second control transistor is coupled to the signal input terminal of the second shift register, and a second electrode of the second control transistor is coupled to the cascade signal input terminal; and wherein the first shift register and the second shift register each comprise: an input sub-circuit, a pull-down control sub-circuit, an output sub-circuit and a pull-down sub-circuit, the input sub-circuit is coupled to the signal input terminal, a pull-up node and a clock signal terminal, and is configured to write, in response to a control of a first clock signal terminal, write an input signal provided by the signal input terminal into the pull-up node;

the pull-down control sub-circuit is coupled to a first operating voltage terminal, the pull-up node, a pull-down node, and the first clock signal terminal, and is configured to write a first operating voltage provided by the first operating voltage terminal to the pull-down node in response to a control of the first clock signal terminal, and write a first clock signal provided by the first clock signal terminal to the pull-down node in response to a control of a voltage at the pull-up node;

the output sub-circuit is coupled to a second operating voltage terminal, the pull-up node, the pull-down node, the signal output terminal, and a second clock signal terminal, and is configured to write a second clock signal provided by the second clock signal terminal to the signal output terminal in response to the control of the voltage at the pull-up node, and write a second operating voltage provided by the second operating voltage terminal to the signal output terminal in response to a control of the pull-down node; and the pull-down sub-circuit is coupled to the second operating voltage terminal, the pull-up node, the pull-down node, and the second clock signal terminal, and is configured to write the second operating voltage to the pull-up node in response to a control of a voltage at the pull-down node and the second clock signal terminal.

2. The shift register unit of claim 1, wherein the input sub-circuit comprises a first transistor, a control electrode of the first transistor is coupled to the first clock signal terminal, a first electrode of the first transistor is coupled to the input signal terminal, and a second electrode of the first transistor is coupled to the pull-up node.

3. The shift register unit of claim 1, wherein the pull-down control sub-circuit comprises a second transistor and a third transistor, a control electrode of the second transistor is coupled to the pull-up node, a first electrode of the second transistor is coupled to the pull-down node, and a second electrode of the second transistor is coupled to the first clock signal terminal; a control electrode of the third transistor is coupled to the first clock signal terminal, a first electrode of the third transistor is coupled to the first operating voltage terminal, and a second electrode of the third transistor is coupled to the pull-down node.

4. The shift register unit of claim 1, wherein the output sub-circuit comprises a fourth transistor and a fifth transistor, a control electrode of the fourth transistor is coupled to the pull-down node, a first electrode of the fourth transistor is coupled to the second operating voltage terminal, and a second electrode of the fourth transistor is coupled to the signal output terminal; and a control electrode of the fifth transistor is coupled to the pull-up node, a first electrode of the fifth transistor is coupled to the signal output terminal, and a second electrode of the fifth transistor is coupled to the second clock signal terminal.

5. The shift register unit of claim 4, wherein the output sub-circuit further comprises an eighth transistor, a first capacitor, and a second capacitor, wherein a control electrode of the eighth transistor is coupled to the first operating voltage terminal, a first electrode of the eighth transistor is coupled to the pull-up node, and a second electrode of the eighth transistor is coupled to the control electrode of the fifth transistor; a first terminal of the first capacitor is coupled to the control electrode of the fifth transistor, and a second terminal of the first capacitor is coupled to the signal output terminal; a first terminal of the second capacitor is coupled to the pull-down node, and a second terminal of the second capacitor is coupled to the first electrode of the fourth transistor.

6. The shift register unit of claim 1, wherein the pull-down sub-circuit comprises a sixth transistor and a seventh transistor, a control electrode of the sixth transistor is coupled to the pull-down node, a first electrode of the sixth transistor is coupled to the second operating voltage terminal, a second electrode of the sixth transistor is coupled to a first electrode of the seventh transistor, a control electrode of the seventh transistor is coupled to the second clock signal terminal, and a second electrode of the seventh transistor is coupled to the pull-up node.

7. The shift register unit of claim 1, wherein the input sub-circuit comprises a first transistor, the pull-down control sub-circuit comprises a second transistor and a third transistor, the output sub-circuit comprises a fourth transistor and a fifth transistor, the pull-down sub-circuit comprises a sixth transistor and a seventh transistor, and wherein a control electrode of the first transistor is coupled to the first clock signal terminal, a first electrode of the first transistor is coupled to the input signal terminal, and a second electrode of the first transistor is coupled to the pull-up node;

a control electrode of the second transistor is coupled to the pull-up node, a first electrode of the second transistor is coupled to the pull-down node, and a second electrode of the second transistor is coupled to the first clock signal terminal;

a control electrode of the third transistor is coupled to the first clock signal terminal, a first electrode of the third transistor is coupled to the first operating voltage terminal, and a second electrode of the third transistor is coupled to the pull-down node;

a control electrode of the fourth transistor is coupled to the pull-down node, a first electrode of the fourth transistor is coupled to the second operating voltage terminal, and a second electrode of the fourth transistor is coupled to the signal output terminal;

a control electrode of the fifth transistor is coupled to the pull-up node, a first electrode of the fifth transistor is coupled to the signal output terminal, and a second electrode of the fifth transistor is coupled to the second clock signal terminal;

a control electrode of the sixth transistor is coupled to the pull-down node, a first electrode of the sixth transistor is coupled to the second operating voltage terminal, and a second electrode of the sixth transistor is coupled to a first electrode of the seventh transistor; and a control electrode of the seventh transistor is coupled to the second clock signal terminal, and a second electrode of the seventh transistor is coupled to the pull-up node.

8. The shift register unit of claim 7, wherein all transistors in the shift register unit are N-type transistors; or all the transistors in the shift register unit are P-type transistors.

9. The shift register unit of claim 1, wherein the input sub-circuit comprises a first transistor; the pull-down control sub-circuit comprises a second transistor and a third transistor; the output sub-circuit comprises a fourth transistor, a fifth transistor, an eighth transistor, a first capacitor and a second capacitor; the pull-down sub-circuit comprises a sixth transistor and a seventh transistor, and wherein a control electrode of the first transistor is coupled to the first clock signal terminal, a first electrode of the first transistor is coupled to the input signal terminal, and a second electrode of the first transistor is coupled to the pull-up node;

a control electrode of the second transistor is coupled to the pull-up node, a first electrode of the second transistor is coupled to the pull-down node, and a second electrode of the second transistor is coupled to the first clock signal terminal;

a control electrode of the third transistor is coupled to the first clock signal terminal, a first electrode of the third transistor is coupled to the first operating voltage terminal, and a second electrode of the third transistor is coupled to the pull-down node;

a control electrode of the fourth transistor is coupled to the pull-down node, a first electrode of the fourth transistor is coupled to the second operating voltage terminal, and a second electrode of the fourth transistor is coupled to the signal output terminal;

a control electrode of the fifth transistor is coupled to a second electrode of the eighth transistor, a first electrode of the fifth transistor is coupled to the signal output terminal, and a second electrode of the fifth transistor is coupled to the second clock signal terminal;

a control electrode of the sixth transistor is coupled to the pull-down node, a first electrode of the sixth transistor is coupled to the second operating voltage terminal, and a second electrode of the sixth transistor is coupled to a first electrode of the seventh transistor;

a control electrode of the seventh transistor is coupled to the second clock signal terminal, and a second electrode of the seventh transistor is coupled to the pull-up node;

a control electrode of the eighth transistor is coupled to the first operating voltage terminal, and a first electrode of the eighth transistor is coupled to the pull-up node;

a first terminal of the first capacitor is coupled to the control electrode of the fifth transistor, and a second terminal of the first capacitor is coupled to the signal output terminal; and a first terminal of the second capacitor is coupled to the pull-down node, and a second terminal of the second capacitor is coupled to the first electrode of the fourth transistor.

10. The shift register unit of claim 9, wherein all transistors in the shift register unit are N-type transistors; or all the transistors in the shift register unit are P-type transistors.

11. A driving method of the shift register unit of claim 1, comprising:

controlling the switch control circuit to write the cascade signal provided by the cascade signal input terminal into the signal input terminal of the first shift register and/or the signal input terminal of the second shift register; and enabling the first shift register and/or the second shift register to operate according to the received cascade signal.

12. The driving method of claim 11, wherein the switch control circuit comprises: a first gating sub-circuit and a second gating sub-circuit, the first gating sub-circuit is coupled to a first control signal terminal, the cascade signal input terminal and the signal input terminal of the first shift register, and is configured to allow, in response to a control of a first control signal provided by the first control signal terminal, a current between the signal input terminal of the first shift register and the cascade signal input terminal or not; the second gating sub-circuit is coupled to a second control signal terminal, the cascade signal input terminal, and the signal input terminal of the second shift register, and is configured to allow, in response to a control of a second control signal provided by the second control signal terminal, a current between the signal input terminal of the second shift register and the cascade signal input terminal or not, and wherein the controlling the switch control circuit to write the cascade signal provided by the cascade signal input terminal into the signal input terminal of the first shift register and/or the signal input terminal of the second shift register comprises:

the first gating sub-circuit allows, in response to the control of the first control signal, a current between the signal input terminal of the first shift register and the cascade signal input terminal or not; and/or the second gating sub-circuit allows, in response to the control of the second control signal, a current between the signal input terminal of the second shift register and the cascade signal input terminal or not.

13. A gate driving circuit, comprising: a plurality of shift register units cascaded, each of the shift register units is configured with a corresponding cascade signal input terminal and a driving signal output terminal, wherein at least one of the shift register units is the shift register unit of claim 1;

except the shift register unit in the first stage, the cascade signal input terminal of each of the shift register units in other stages is coupled to the driving signal output terminal of the shift register unit in the previous stage.

14. The gate driving circuit of claim 13, wherein the switch control circuit comprises: a first gating sub-circuit and a second gating sub-circuit, the first gating sub-circuit is coupled to a first control signal terminal, the cascade signal input terminal and the signal input terminal of the first shift register, and is configured to allow, in response to a control of a first control signal provided by the first control signal terminal, a current between the signal input terminal of the first shift register and the cascade signal input terminal or not; the second gating sub-circuit is coupled to a second control signal terminal, the cascade signal input terminal, and the signal input terminal of the second shift register, and is configured to allow, in response to a control of a second control signal provided by the second control signal terminal, a current between the signal input terminal of the second shift register and the cascade signal input terminal or not, and wherein first control signal terminals coupled to first gating sub-circuits in all the shift register units are the same signal terminal; and second control signal terminals coupled to second gating sub-circuits in all the shift register units are the same signal terminal.

15. A display device, comprising: the gate driving circuit of claim 14.

16. A display device, comprising: the gate driving circuit of claim 13.

17. A driving method of the gate driving circuit of claim 13, comprising:

detecting whether an output current of the first shift register in each shift register unit is normal or not;

in response to that the first shift register whose output current is abnormal exists, determining a current stage of the shift register unit where the abnormal first shift register is located; and after the shift register unit in a stage immediately previous to the current stage of shift register unit outputs a driving signal, allowing, by the switch control circuit, a current through the second shift register in the shift register unit in the current stage, and allowing no current through the first shift register in the shift register unit in the current stage.

* * * * *